United States Patent
Subramaniam et al.

(10) Patent No.: US 10,193,657 B2
(45) Date of Patent: Jan. 29, 2019

(54) FILTERING CODE BLOCKS TO MAINTAIN HIGH THROUGHPUT THRU A FORWARD ERROR CORRECTION DECODER

(71) Applicants: Bala Subramaniam, Potomac, MD (US); Alexei Duhovich, Austin, TX (US)

(72) Inventors: Bala Subramaniam, Potomac, MD (US); Alexei Duhovich, Austin, TX (US)

(73) Assignee: Hughes Network Systems, LLC, Germantown, MD (US)

( * ) Notice: Subject to any disclaimer, the term of this patent is extended or adjusted under 35 U.S.C. 154(b) by 33 days.

(21) Appl. No.: 15/392,103

(22) Filed: Dec. 28, 2016

(65) Prior Publication Data

US 2018/0183545 A1    Jun. 28, 2018

(51) Int. Cl.
| | |
|---|---|
| *H04L 1/00* | (2006.01) |
| *H04L 12/26* | (2006.01) |
| *H04L 1/20* | (2006.01) |
| *H03M 13/35* | (2006.01) |

(52) U.S. Cl.
CPC ........ *H04L 1/0045* (2013.01); *H03M 13/356* (2013.01); *H04L 1/0053* (2013.01); *H04L 1/20* (2013.01); *H04L 43/0888* (2013.01); *H04L 43/16* (2013.01); *H04L 1/0036* (2013.01)

(58) Field of Classification Search
CPC ... H04H 20/51; H04L 1/0046; H04L 43/0888; H04L 1/0036; H04L 1/0053; H04L 1/0045; H04L 43/16; H04N 3/36; H04N 7/20; H03M 13/356
See application file for complete search history.

(56) References Cited

U.S. PATENT DOCUMENTS

| | | | |
|---|---|---|---|
| 8,707,126 B2 * | 4/2014 | Lee | H04H 20/51 714/752 |
| 2016/0233979 A1 | 8/2016 | Koike-Akino | |

FOREIGN PATENT DOCUMENTS

EP    2416515 A2    2/2012

OTHER PUBLICATIONS

Arnau et al., Adaptive transmission techniques for mobile Satellite links, 2013, Google.com, pp. 1 to 14.*
International Search Report for PCT/US2017/067509 dated Apr. 16, 2018.

(Continued)

*Primary Examiner* — Shelly A Chase
(74) *Attorney, Agent, or Firm* — Capitol City TechLaw; Jasbir Singh

(57) ABSTRACT

A system and method for filtering code blocks to maintain high throughput thru a Forward Error Correcting (FEC) decoder is disclosed. The method includes: monitoring a Signal-to-Noise Ratio (SNR) for an incoming link; selecting a rank table including a rank, Modulation and Coding Rate (MODCOD), and a minimum SNR; determining a threshold MODCOD range from the rank table based on the SNR; demodulating an incoming frame; identifying, in the incoming frame, the code blocks and an associated MODCOD for each of the code blocks; selecting a code block from the code blocks when the respective MODCOD for the code block is in the rank table and within the threshold MODCOD range; and decoding the selected code block with the associated MODCOD.

20 Claims, 3 Drawing Sheets

(56) References Cited

OTHER PUBLICATIONS

Majid Safari et al: "Relay-Assisted Free-Space Optical Communication", Conference Record of the Forty-First Asilomar Conference on Signals, Systems & Computers, 2007: Nov. 4-7, 2007, Pacific Grove, California / Ed. By Michael B. Matthews. In Cooperation With the Naval Postgraduate School, Monterey, California, PI, Nov. 4, 2007 (Nov. 4, 2007), pp. 1891-1895, XP031242406, ISBN: 978-1-4244-2109-1, abstract, section 11.B.

* cited by examiner

| RANK | ModCode | Modulation | Code Rates | Min SNR |
|---|---|---|---|---|
| 1 | 1 | QPSK | 1/4 | -1.0 |
| 2 | 2 | QPSK | 1/3 | -0.5 |
| 3 | 3 | QPSK | 2/5 | 0.0 |
| 4 | 134 | QPSK | 9/20 | 0.50 |
| 5 | 4 | QPSK | 1/2 | 1.0 |
| 6 | 30 | QPSK | 1/2 | 1.5 |
| 7 | 136 | QPSK | 11/20 | 2.0 |
| 8 | 5 | QPSK | 3/5 | 2.5 |
| 9 | 6 | QPSK | 2/3 | 3.0 |
| 10 | 7 | QPSK | 3/4 | 3.5 |
| 11 | 8 | QPSK | 4/5 | 4.0 |
| 12 | 9 | QPSK | 5/6 | 4.5 |
| 13 | 12 | 8PSK | 3/5 | 5.0 |
| 14 | 10 | QPSK | 8/9 | 5.5 |
| 15 | 142 | 8PSK | 23/36 | 6.0 |
| 16 | 11 | QPSK | 9/10 | 6.5 |
| 17 | 13 | 8PSK | 2/3 | 7.0 |
| 18 | 144 | 8PSK | 25/36 | 7.5 |
| 19 | 146 | 8PSK | 13/18 | 8.0 |
| 20 | 154 | 16APSK | 26/45 | 8.5 |
| 21 | 14 | 8PSK | 3/4 | 9.0 |
| 22 | 156 | 16APSK | 3/5 | 9.5 |
| 23 | 158 | 16APSK | 28/45 | 10.0 |
| 24 | 160 | 16APSK | 23/36 | 10.5 |
| 25 | 18 | 16APSK | 2/3 | 11.0 |
| 26 | 29 | 16APSK | 2/3 | 11.5 |
| 27 | 15 | 8PSK | 5/6 | 12.0 |
| 28 | 162 | 16APSK | 25/36 | 12.5 |
| 29 | 164 | 16APSK | 13/18 | 13.0 |
| 30 | 19 | 16APSK | 3/4 | 13.5 |
| 31 | 16 | 8PSK | 8/9 | 14.0 |
| 32 | 166 | 16APSK | 7/9 | 14.5 |
| 33 | 17 | 8PSK | 9/10 | 15.0 |
| 34 | 20 | 16APSK | 4/5 | 15.5 |
| 35 | 170 | 32APSK | 2/3 | 16.0 |
| 36 | 21 | 16APSK | 5/6 | 16.5 |
| 37 | 172 | 32APSK | 25/36 | 17.0 |
| 38 | 168 | 16APSK | 31/36 | 17.5 |
| 39 | 174 | 32APSK | 13/18 | 18.0 |
| 40 | 22 | 16APSK | 8/9 | 18.5 |
| 41 | 24 | 32APSK | 3/4 | 19.0 |
| 42 | 23 | 16APSK | 9/10 | 19.5 |
| 43 | 176 | 32APSK | 7/9 | 20.0 |
| 44 | 25 | 32APSK | 4/5 | 20.5 |
| 45 | 26 | 32APSK | 5/6 | 21.0 |
| 46 | 182 | 64APSK | 13/18 | 21.5 |
| 47 | 184 | 64APSK | 3/4 | 22.0 |
| 48 | 186 | 64APSK | 7/9 | 22.5 |
| 49 | 27 | 32APSK | 8/9 | 23.0 |
| 50 | 28 | 32APSK | 9/10 | 23.5 |
| 51 | 190 | 64APSK | 4/5 | 24.0 |
| 52 | 194 | 64APSK | 5/6 | 24.5 |
| 53 | 196 | 64APSK | 31/36 | 25.0 |

FIG. 3

THRESHOLD MODCOD RANGE – 1 to 34

|  | QPSK | 32 APSK | 8 PSK | 32 APSK | 16 APSK | 32 APSK |
|---|---|---|---|---|---|---|
| MODCODE | 11 | 176 | 15 | 170 | 166 | 26 |
| RANK | 16 | 43 | 27 | 35 | 34 | 45 |
| ACTION | 11 | *DROPPED* | 15 | *DROPPED* | 166 | *DROPPED* |

| DECODE DURATION | *Decode MODCOD 11* | *Decode MODCOD 15* | *Decode MODCOD 166* |
|---|---|---|---|

FILTERING CODE BLOCKS TO MAINTAIN HIGH THROUGHPUT THRU A FORWARD ERROR CORRECTION DECODER

FIELD

The present teachings disclose a method and a system for a Modulation/Coding (MODCOD) filtering of the received frames to maintain high throughput thru a Forward Error Correcting (FEC) decoder. In particular, a current Signal-to-Noise Ratio (SNR) is used to set a threshold MODCOD range. A coded block of data is discarded without processing by the FEC decoder, either when the MODCOD for encoding the block is not listed in a MODCOD rank table or when the coded block was encoded by a MODCOD not included in the threshold MODCOD range.

BACKGROUND

In a wideband channel DVB-S2 satellite system, a Low-Density Parity-Check (LDPC) decoder demand throughput could be in excess of 1 Gigabits per second (Gbps). An LDPC decoder implementation at 1 Gbps requires considerable complexity and consumes excessive power. All the terminals in satellite beam share a common forward bit stream at 1 Gbps. However, usually a particular terminal's user data rate is usually no more than 100 Megabits per second (Mbps).

The forward bit stream is formed using DVB-S2 frame format specification that uses LDPC decoding on the frames. In the prior art, the Very Small Aperture Terminal (VSAT) LDPC decoder process all the incoming frames. After the LDPC processing, the VSAT discards the frames not intended for the VSAT itself. In some embodiments, the VSAT uses a MAC address to filter the incoming frames. The disadvantage of this method is that the VSAT wastes a lot of processing throughput and power to decode frames not intended for it.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

The present teachings disclose a method and a system for a Modulation/Coding (MODCOD) filtering of the received frames to maintain high throughput thru a Forward Error Correcting (FEC) decoder. In particular, a current Signal-to-Noise Ratio (SNR) is used to set a threshold MODCOD range. A coded block of data is discarded without processing by the FEC decoder, either when the MODCOD for encoding the block is not listed in a MODCOD rank table or when the coded block was encoded by a MODCOD not included in the threshold MODCOD range.

A method for filtering code blocks to maintain high throughput thru a Forward Error Correcting (FEC) decoder is disclosed. The method includes: monitoring a Signal-to-Noise Ratio (SNR) for an incoming link; selecting a rank table including a rank, Modulation and Coding Rate (MODCOD), and a minimum SNR; determining a threshold MODCOD range from the rank table based on the SNR; demodulating an incoming frame; identifying, in the incoming frame, the code blocks and an associated MODCOD for each of the code blocks; selecting a code block from the code blocks when the respective MODCOD for the code block is in the rank table and within the threshold MODCOD range; and decoding the selected code block with the associated MODCOD.

A system to filter code blocks to maintain high throughput thru a Forward Error Correcting (FEC) decoder is disclosed. The system includes: a Signal-to-Noise Ratio (SNR) estimator to estimate an SNR for an incoming link; a MODCOD filter to select a rank table including a rank, Modulation and Coding Rate (MODCOD), and a minimum SNR, and to determine a threshold MODCOD range from the rank table based on the SNR; a demodulator to demodulate an incoming frame, and to identify, in the incoming frame, the code blocks and an associated MODCOD for each of the code blocks; a code block selector to select a code block from the code blocks when the respective MODCOD for the code block is in the rank table and within the threshold MODCOD range; and a decoder to decode the selected code block with the associated MODCOD.

Additional features will be set forth in the description that follows, and in part will be apparent from the description, or may be learned by practice of what is described.

DRAWINGS

In order to describe the manner in which the above-recited and other advantages and features may be obtained, a more particular description is provided below and will be rendered by reference to specific embodiments thereof which are illustrated in the appended drawings. Understanding that these drawings depict only typical embodiments and are not therefore to be considered to be limiting of its scope, implementations will be described and explained with additional specificity and detail through the use of the accompanying drawings.

FIG. 3 illustrates an exemplary rank table according to various embodiments.

Figure 1:
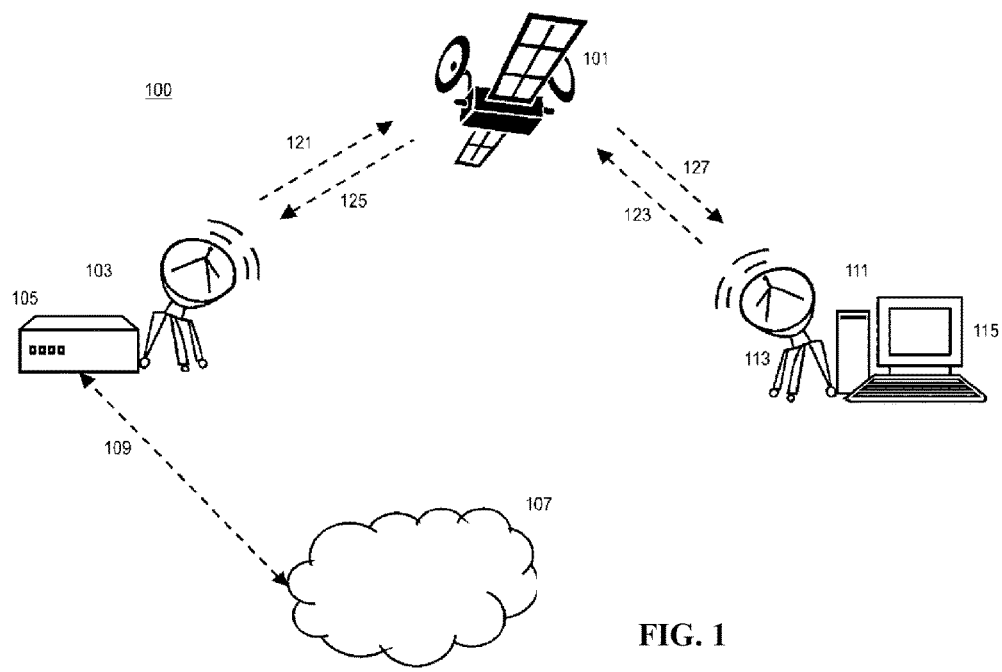
FIG. 1 illustrates a radio communication system or exemplary operating environment according to various embodiments.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Embodiments are discussed in detail below. While specific implementations are discussed, it should be understood that this is done for illustration purposes only. A person skilled in the relevant art will recognize that other components and configurations may be used without parting from the spirit and scope of the subject matter of this disclosure.

The terminology used herein is for describing particular embodiments only and is not intended to be limiting of the present disclosure. As used herein, the singular forms "a," "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first," "second," and the like does not imply any particular order, but they are included to either identify individual elements or to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Although some features may be described with respect to individual exemplary embodiments, aspects need not be limited thereto such that features from one or more exemplary embodiments may be combinable with other features from one or more exemplary embodiments.

The present teachings disclose a method and a system for a Modulation/Coding (MODCOD) filtering of the received frames to maintain high throughput thru a Forward Error Correcting (FEC) decoder. In particular, a current Signal-to-Noise Ratio (SNR) is used to set a threshold MODCOD range. A coded block of data is discarded without processing by the FEC decoder, either when the MODCOD for encoding the block is not listed in a MODCOD rank table or when the coded block was encoded by a MODCOD not included in the threshold MODCOD range.

Assuming that incoming frames are encoded at a symbol rate of 200 Mega Symbols per Second (Msps), then a decoder's throughput may need to be as high as 1 Gigabits per second (Gbps) at, for example, 32 APSK modulation. Without the present teachings, the decoder can only sustain the number of iterations equal to the frame length. So, for example, for 32 APSK modulation the decoder will only get 12 iterations to perform the forward error correction. Similarly, the decoder gets 16 iterations for 16 APSK modulation, the decoder gets 20 iterations for 8 PSK modulation, the decoder gets 20 iterations for 8 PSK; the decoder gets 24 iterations for QPSK modulation, and the like.

As is evident, the number of iterations available for the decoder are not equal for the various modulations, for example, performance of QPSK modulation will be better than 32 APSK modulation as the number of iterations possible for 32 APSK modulation is fewer.

With the present teachings, the time gained from the dropped frames may be allocated to modulations that require more time. As such, modulations such as 32 APSK and 16 APSK may be decoded with higher than 12 iterations and 16 iterations, respectively. This improves the frame error rate performance over the prior art.

In some embodiments, as higher throughput is demanded by wideband High Throughput Satellites (HTS), their frame error rate performance will be further degraded without the present teachings. For example, if the HTS is operating at 400 Msps, the 32 APSK modulation will need to be decoded in 6 iterations. This will impact the performance of 32 APSK significantly (as much as 1 to 2 db).

FIG. 1 illustrates a radio communication system or exemplary operating environment according to various embodiments.

An exemplary system 100 may include at least one satellite 101 (or a High Altitude Platform (HAP)) and at least one gateway 103 connected via a server or base station 105 to a network 107. The connection 109 between the server and base station 105 to the network 107 may be wired, wireless, or a combination thereof. The network 107 includes one or more wired/data networks (for example, LAN, MAN, WAN, the internet, and the like.) and one or more wireless networks (for example, TDMA, GSM, CDMA, GPRS, EDGE, MBMS, DVB, CSD, HSCSD, and the like.).

The system 100 may include a subscriber system 111. The subscriber system 111 may include an IFL connecting at least one Very Small Aperture Terminal (VSAT) 113 and a subscriber terminal 115. The subscribers may be individuals, business entities, governmental agencies, or the like. The subscriber terminal 115 may include access points configured to communicate with other subscriber terminals in the network 107 using, for example, radio frequency (RF), Bluetooth (BT), infrared (IrDA) or any of a number of different wireless networking techniques, including WLAN techniques. The subscriber terminal 115 may be disposed indoors, while the at least one VSAT 113 including a radio may be disposed outdoors.

The VSAT 113 may be utilized at a location for communicating via the satellite 101 to the gateway 103. The gateway 103 communicates with multiple VSATs, and has a significantly larger antenna, as well as a significantly larger power output capability than any of the VSATs. The communication satellite 101 receives uplink signals 121 from the gateway 103 and uplink signals 123 from the VSAT 113. The communication satellite 101 transmits downlink signals 125 to the gateway 103 and downlink signals 127 to the VSAT 113. The gateway 103 sends communication signals to the VSAT 113 via a forward link including the uplink 121 and the downlink 127. The VSAT 113 sends communications signals to the gateway 103 via the return link including the uplink 123 and the downlink 125. In exemplary embodiments, the communication satellite 101 receives signals at a first frequency and transmits signals at a second frequency different from the first frequency.

In some embodiments, no relays or multiple relays (for example, the satellite 101, a High Altitude Platform (HAP), or the like) may be used to communicate between the remote ground terminal 113 and the gateway 103.

In exemplary embodiments, fade conditions at the gateway 103 and the VSAT 113 may differ, for example, when the gateway 103 is disposed over 20 miles from the VSAT 113, or when the signals between the gateway 103 and the VSAT 113 utilize an intermediary transceiver, like a satellite or a HAP 101. When fade conditions differ for the gateway 103 and the VSAT 113, a signal strength of the outroute 127 may be measured at the VSAT 113 and fed back to the gateway 103, for example, via a packet over the inroute 123, 125. When fade conditions differ for the gateway 103 and the VSAT 113, a signal strength of the inroute 125 may be measured at the gateway 103 and fed back to the VSAT 113, for example, via a packet over the outroute 121, 127.

In some embodiments, regardless of whether fade conditions are the same or different for the gateway 103 and the VSAT 113, a signal strength of the inroute 125 may be assumed to be approximately the same as a signal strength of the outroute 127 at the VSAT 113. Such an assumption can eliminate the need for the feedback to the gateway 103 from the VSAT 113.

In exemplary embodiments, signal quality on a route (channel) may be measured using a well-known unencoded bit pattern sent whose bit error rate correlates to a signal strength via methods well known in the art. For example, signal quality on a route (channel) may be measured as signal strength or Signal to Noise Ratio (SNR). In other examples, a Signal to Noise Ratio (SNR) divided by the number of bits/symbols may be known as a signal quality (Es/No).

In exemplary embodiments, a VSAT may drop incoming frames not intended for the VSAT prior to processing by the Low-Density Parity-Check (LDPC) decoder. This enables a VSAT to support wideband channel while maintaining good frame error performance. The present teachings disclose a method for filtering the incoming frames based on a VSAT's SNR. In exemplary embodiments, the VSAT may maintain a rank order of the MODCOD based on the VSAT's SNR.

Figure 2:
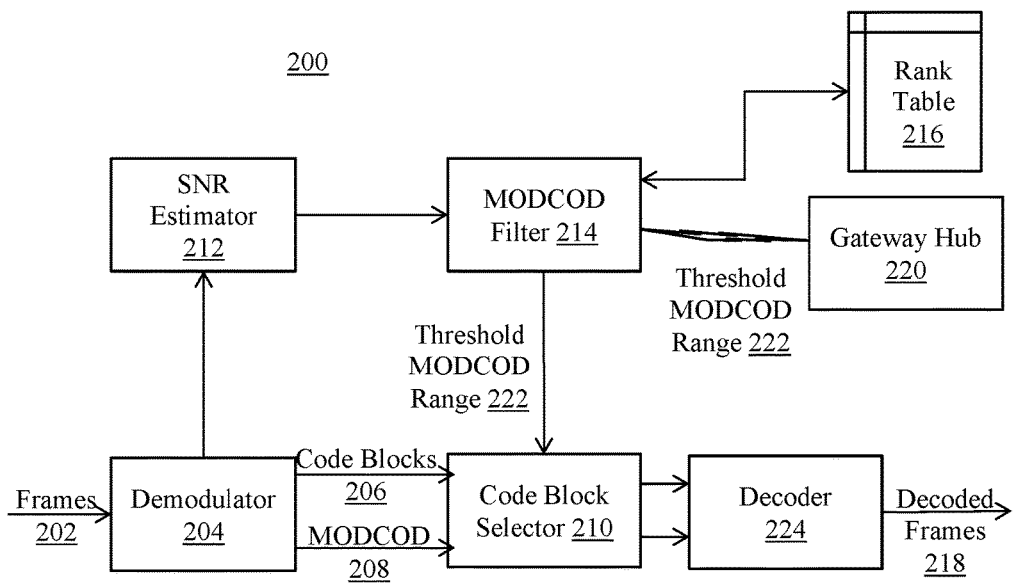
FIG. 2 illustrates a schematic block diagram for a system to maintain high throughput thru a forward error correcting decoder according to various embodiments.

FIG. 2 illustrates a schematic block diagram for a system to maintain high throughput thru a forward error correcting decoder according to various embodiments.

A system 200 to maintain high throughput thru a forward error correcting decoder 224 is disclosed. The system 200 may include a demodulator 204, a code block selector 210, an SNR estimator 212, a MODCOD filter 214 and a rank table 216. An incoming frame 202 is received by the demodulator 204. The demodulator 204 identifies code blocks 206 and a MODCOD associated with each of the code blocks and provides that to the code block selector 210.

The system 200 may be included in a VSAT, for example, VSAT 113 of FIG. 1. The SNR estimator 212 may provide the VSAT's SNR to the MODCOD filter 214. In some embodiments, the MODCOD filter 214 may select a rank table 216 and determine a threshold MODCOD range 222. The MODCOD filter 214 may provide the SNR and/or the threshold MODCOD range 222 to a gateway hub 220 that is transmitting frames to the VSAT. The MODCOD filter 214 may also provide the threshold MODCOD range 222 to the code block selector 210.

The code block selector 210 may then drop incoming code blocks 206 whose associated MODCOD 208 is not within the threshold MODCOD range 222 or included in the selected rank table 216. Without limitation, this may be done as the gateway hub 220 communicating with the VSAT does not transmit code blocks to the VSAT outside the threshold MODCOD range 222 associated with the VSAT. As the VSAT channel conditions change due to signal fade or the like (clear sky to rain, blockage/obstruction between a satellite and the VSAT, etc.) the SNR estimator 212 monitors and dynamically updates the SNR and provides the SNR to the MODCOD filter 214. The MODCOD filter in turn updates the threshold MODCOD range 222 for the code block selector 210 and/or the gateway hub 220. Any code block 206, with the associated MODCOD, eligible or selected for decoding are provided by the code block selector 210 to the decoder 224. The decoder 224 decodes the selected code blocks 206 to generate a decoded frame 218.

FIG. 3 illustrates an exemplary rank table according to various embodiments.

In some embodiments, the MODCOD's supported by the VSAT may be implemented per the Digital Video Broadcasting-Satellite-$2^{nd}$ Generation (DVB-S2) standard, and the incoming frames may comply with the DVB-S2 standard. FIG. 3 illustrates a DVB-S2 standard rank table listing a rank, modcode, modulation scheme for the demodulator, code rate for the decode and a minimum SNR. In some embodiments, the minimum SNR may be provided as a necessary signal quality (Es/No) and the minimum SNR may be calculated or derived from the Es/No.

In some embodiments, the satellite system communicating with VSATs may utilize a single rank table for all the VSATs.

In some embodiments, the satellite system communicating with VSATs may utilize a plurality of rank tables for various populations of VSATs, for example, by using the same rank table for one of the populations of the VSATs. The plurality of rank tables may be mutually non-overlapping or partially over-lapping rank tables with a different table for different sets or populations of VSATs. In some embodiments, MODCOD filtering may be tuned to various classes or populations of VSATs. One exemplary class of VSATs may include large antenna VSATs with no restrictions. Another exemplary class of VSATs may include small antenna mobile VSATs that may be limited to the highest ranks to correspond to a certain SNR, for example, 8 dB. Another exemplary class of VSATs may include VSATs where the disposition of the decoder is a concern, for example, when the decoder in an outdoor unit, in an uncontrolled environment (heat), in a region where power consumption must be restricted, or the like. In such conditions, the code block selector described herein may drop every other code block to save power or generate less heat or the like.

The present teachings disclose a system and method for dropping some code blocks in an incoming frame prior to a LDPC decoder. In some embodiments, the LDPC decoder may not be capable of decoding with sufficient robustness some of the code blocks within the incoming frame. In some embodiments, the LDPC decoder may be set to a low power mode, and thus set to not decode every code block or the like. The present teachings may eliminate unnecessary decoding of the LDPC frames not intended for the VSAT. This allow the LDPC decoder to allocate more iterations for any LDPC encoded incoming frames targeted for the VSAT. By allocating more iterations in the LDPC decoder to the incoming frames, the LDPC decoder's frame error performance is improved.

The incoming frames are coded using various modulation and FEC rates. A particular combination of modulation and FEC rate is defined as MODCOD (modulation-coding). The incoming frames have a mixture of different MODCOD; this is called Adaptive Coding Modulation (ACM). The VSAT demodulator measures the Signal-to-Noise (SNR) of the incoming frames. This SNR is relayed back to a gateway hub of a satellite network. Depending on the terminal receive SNR, the Gateway Hub transmits information in frames using MODCODs that the VSAT can successfully receive and decode.

In some embodiments, a VSAT may maintain a rank table of the SNR's of the different MODCODs that the VSAT can decode. A MODCOD filter may be implemented before the LDPC decoder. The VSAT monitors transmissions from the gateway hub and determines the SNR limit that it can successfully receive and decode. The VSAT then communicates the SNR limit to the Gateway Hub, and sets the MODCOD filter according to a threshold MODCOD range based on the SNR limit. The MODCOD filter then filters and discards all the frames not within the threshold MODCOD range. The filtered frames intended for the VSAT from the Gateway Hub only includes frames within the threshold MODCOD range.

In some embodiments, hysteresis in response to the SNR may be a concern, for example, when changing fade conditions necessitate avoiding a change to the threshold RANK too often as it may cause loss in capacity/performance.

In some embodiments, the code block filtering threshold rank may be set to be the SNR plus a hysteresis managing constant, for example, 0.5 dB. In one example, by adding a 0.5 dB to the SNR, the MODCOD filter may set the threshold rank to be 23 instead of 21. In this case, the decoder may process code blocks not intended for the VSAT. However, the higher rank provides allowance in case the SNR improves later.

In some embodiments, the SNR estimator may observe the SNR over a large enough window to accommodate rapidly changing signal conditions. This may provide some averaging and prevent the threshold SNR from changing too often.

In some embodiments, the threshold MODCOD range may be limit a VSAT to low power consuming SNRs regardless of the present SNR. This could be done to lower the throughput of the decoder. For example, the code block selector may send every other code block to the decoder to reduce power by half even though this halves the decoder throughput. In some embodiments, the code block selector may selectively only send the MODCOD supported by the VSAT, for example, the code block selector may only send only QPSK and 8 PSK modulations to the decoder.

In some embodiments, the threshold MODCOD range may include a range of MODCODs (minimum and maximum thresholds) that are valid for an SNR. In this embodiment, the filtering may be based on a range of MODCODs based on SNR. So for example if the VSAT reports a SNR of 8 dB, the filtering can be done either to filter out all MODCODs with rank greater than 21. In some embodiments, the filtering may filter out all MODCODs within a rank region less than or equal to 21, for example, a rank from 11 to 21. In exemplary embodiments, the upper threshold and lower threshold of ranks may be determined in the MODCOD filter of FIG. 2. In another embodiment, the filtering may only pass through only MODCODs with a specific modulation, for example, QPSK modulation. In exemplary embodiments, the minimum threshold may be set to the lowest rank in the rank table.

As such, the LDPC Decoder then only decodes frames that could possibly be intended for the VSAT. The time gained by discarding the frames that the terminal is not capable of decoding can be used to decode the frames possibly intended for this terminal. This enables the LDPC decoder to run more iterations on the decoding of the possibly intended or wanted frames. In exemplary embodiments, an LDPC decoder is an iterative decoder and its performance improves with more iterations. As such, the present teachings improve the frame error rate of the VSAT. When an LDPC decoder early terminates, for example, when the SNR of the terminal is much higher than required for MODCOD, then the terminal can save power.

Figures 4, 5:
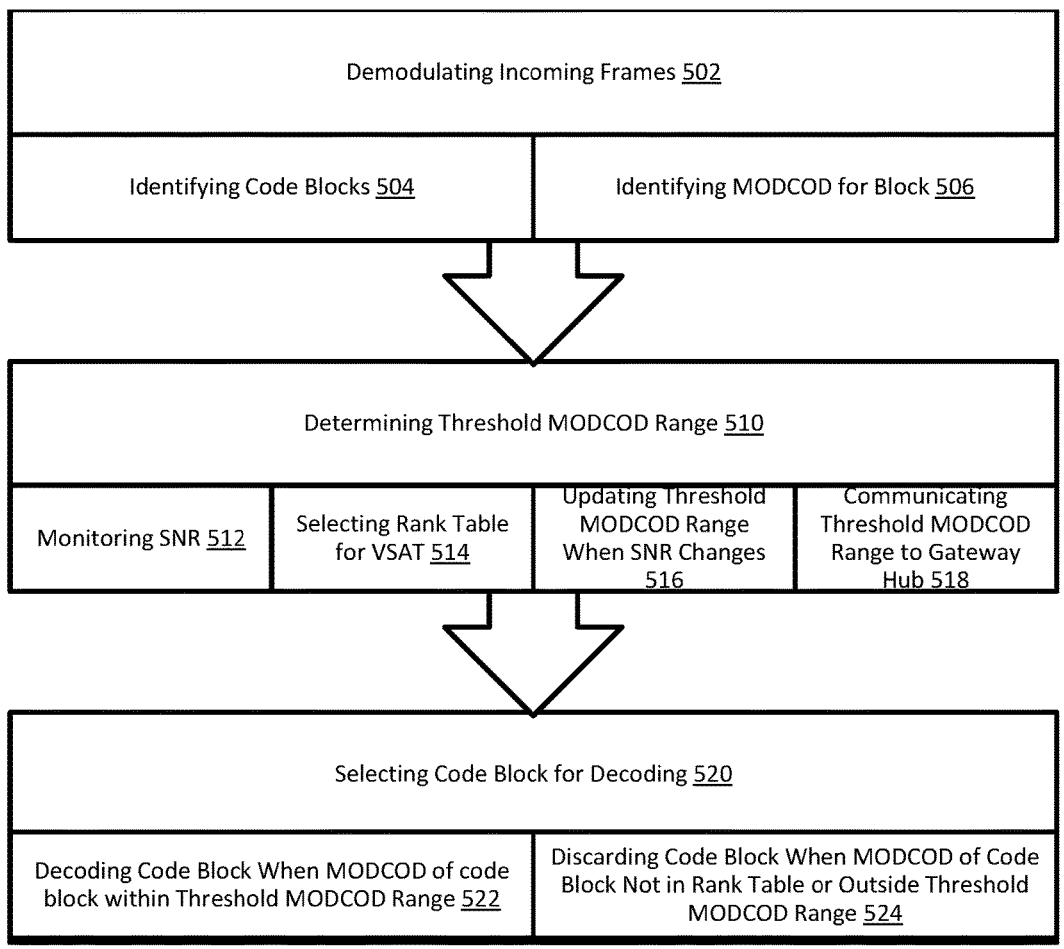
FIG. 4 illustrates a schematic depicting actions taken per the present teachings according to various embodiments.
FIG. 5 illustrates a flowchart of an exemplary method for maintaining high throughput thru a forward error correcting decoder, according to some embodiments.

FIG. 4 illustrates a schematic depicting actions taken per the present teachings according to various embodiments.

FIG. 4 illustrates actions assume that the rank table of FIG. 3 is being used and the threshold MODCOD range has been set from 1 to 34. An exemplary incoming frame includes code blocks encoded with modcodes 11, 176, 15, 170, 166 and 26, with each code block having a rank of 16, 43, 27, 35, 34 and 45, respectively. Given a threshold MODCOD range of 1 to 34, the code block selector 210 of FIG. 2 may drop the second, fourth and sixth code blocks, i.e., code blocks whose rank is outside 1 to 34. By dropping the second, fourth and sixth code blocks, the code block selector 210 of FIG. 2 may allow the decoder 224 of FIG. 2 to decode the first, third and fifth code blocks for a duration including a duration of the code block and a duration of the subsequent code block. The increased duration to decode the code block decreases the respective code blocks error rate.

FIG. 5 illustrates a flowchart of an exemplary method for maintaining high throughput thru a forward error correcting decoder, according to some embodiments.

The present teachings provide a method 500 for maintaining high throughput thru a forward error correcting decoder. The method 500 may be implemented in a VSAT. The method 500 may be implemented by the system 200 of FIG. 2.

In exemplary embodiments, the method 500 includes demodulating incoming frames per operation 502, identifying code blocks per operation 504 and identifying MODCOD for block per operation 506. The method may include determining threshold MODCOD range per operation 510. Operation 510 may include monitoring SNR per operation 512, selecting rank table for VSAT per operation 514, updating threshold MODCOD range when SNR changes per operation 516, and communicating threshold MODCOD range to gateway hub per operation 518.

The method may include selecting code block for decoding per operation 520. Operation 520 may include decoding code block when MODCOD of code block within threshold MODCOD range per operation 522, and discarding code block when MODCOD of code block not in rank table or outside threshold MODCOD range per operation 524.

Embodiment 1

In exemplary embodiments, the present teachings may be implemented in an ASIC. For example, the present teachings may allow the ASIC meet a performance objective. Without the present teachings, the frame error rate performance may be too high and not acceptable. For example, the ASIC may drop frames not intended for the terminal. This may enable the ASIC to maintain a high throughput, for example, greater than 1 Gbps. The time gained from the dropped frames can then be allocated to decoding of frames intended for the terminal to improve frame error rate performance.

Embodiment 2

In some embodiments, throughput of a front-end signal processing has been increased from a symbol-rate of 225 Msps to 235 Msps, and from a bit-rate of 450 Mbps to 1.175 Gbps, while keeping the clock rate at 240 MHz. To maintain the throughput in this embodiment, a Code Block Selector (CBS) De-Mux block is used to drop the specific number of frames in the incoming data streams. Otherwise, the deinterleaver gets overflow and eventually drop the frames at its input. In this embodiment, the number of iterations for each frame with different modulation type is fixed for LDPC, i.e., even the performance has been achieved, LDPC still runs to finish the fixed iteration, which causes unnecessary power consumption and resource waste.

Although the subject matter has been described in language specific to structural features and/or methodological acts, it is to be understood that the subject matter in the appended claims is not necessarily limited to the specific features or acts described above. Rather, the specific features and acts described above are disclosed as example forms for implementing the claims. Other configurations of the described embodiments are part of the scope of this disclosure. Further, implementations consistent with the subject matter of this disclosure may have more or fewer acts than as described, or may implement acts in a different order than as shown. Accordingly, the appended claims and their legal equivalents should only define the invention, rather than any specific examples given.

We claim as our invention:

1. A method for filtering code blocks to maintain high throughput thru a Forward Error Correcting (FEC) decoder, the method comprising:
   monitoring a Signal-to-Noise Ratio (SNR) for an incoming link;
   selecting a rank table comprising a rank, Modulation and Coding Rate (MODCOD), and a minimum SNR;
   determining a threshold MODCOD range from the rank table based on the SNR;
   demodulating an incoming frame;
   identifying, in the incoming frame, the code blocks and an associated MODCOD for each of the code blocks;
   selecting a code block from the code blocks when the respective MODCOD for the code block is in the rank table and within the threshold MODCOD range; and
   decoding the selected code block with the associated MODCOD.

2. The method of claim 1, wherein the determining comprises determining a highest rank MODCOD based on the SNR, and the threshold MODCOD range ranges from a lowest rank MODCOD included in the rank table to the determined highest rank MODCOD.

3. The method of claim 1, wherein the threshold MODCOD range comprises a MODCOD in the rank table, which MODCOD provides a maximum throughput while needing a minimum SNR less than or equal to the SNR.

4. The method of claim 1, wherein the threshold MODCOD range comprises a MODCOD in the rank table, which MODCOD provides a maximum throughput while needing a minimum SNR less than or equal to the SNR plus a hysteresis managing constant.

5. The method of claim 1, wherein the threshold MODCOD range comprises a MODCOD in the rank table, which MODCOD provides a maximum throughput while needing a minimum SNR less than the SNR minus a power-consumption limiter constant.

6. The method of claim 1, further comprising updating the threshold MODCOD range based on changes to an average SNR over a time period.

7. The method of claim 1, further comprising extending a time period for decoding the code block when an immediately subsequent code block will not be selected for decoding.

8. The method of claim 1, further comprising receiving the incoming frame via a Radio Frequency (RF) transmission based on the Digital Video Broadcasting-Satellite-$2^{nd}$ Generation (DVB-S2) standard.

9. The method of claim 1, further comprising receiving the incoming frame at populations of Very Small Aperture Terminals (VSATs), and
   wherein the rank table comprises selecting a rank table, from a plurality of rank tables that are mutually non-overlapping or partially over-lapping, for a population of the populations of VSATs.

10. The method of claim 1, wherein the rank table lists selected modulation and coding schemes.

11. A system to filter code blocks to maintain high throughput thru a Forward Error Correcting (FEC) decoder, the system comprising:
   a Signal-to-Noise Ratio (SNR) estimator to estimate an SNR for an incoming link;
   a MODCOD filter
      to select a rank table comprising a rank, Modulation and Coding Rate (MODCOD), and a minimum SNR, and
      to determine a threshold MODCOD range from the rank table based on the SNR;
   a demodulator to demodulate an incoming frame, and to identify, in the incoming frame, the code blocks and an associated MODCOD for each of the code blocks;
   a code block selector to select a code block from the code blocks when the respective MODCOD for the code block is in the rank table and within the threshold MODCOD range; and
   a decoder to decode the selected code block with the associated MODCOD.

12. The system of claim 11, wherein the MODCOD filter determines a highest rank MODCOD based on the SNR, and the threshold MODCOD range ranges from a lowest rank MODCOD included in the rank table to the determined highest rank MODCOD.

13. The system of claim 11, wherein the threshold MODCOD range comprises a MODCOD in the rank table, which MODCOD provides a maximum throughput while needing a minimum SNR less than or equal to the SNR.

14. The system of claim 11, wherein the threshold MODCOD range comprises a MODCOD in the rank table, which MODCOD provides a maximum throughput while needing a minimum SNR less than or equal to the SNR plus a hysteresis managing constant.

15. The system of claim 11, wherein the threshold MODCOD range comprises a MODCOD in the rank table, which MODCOD provides a maximum throughput while needing a minimum SNR less than the SNR minus a power-consumption limiter constant.

16. The system of claim 11, wherein the MODCOD filter updates the threshold MODCOD range based on changes to an average SNR over a time period.

17. The system of claim 11, wherein the code block selector extends a time period for the decoder to decode the code block when an immediately subsequent code block will not be selected for decoding.

18. The system of claim 11, further comprising a receiver to receive the incoming frame via a Radio Frequency (RF) transmission based on the Digital Video Broadcasting-Satellite-$2^{nd}$ Generation (DVB-S2) standard.

19. The system of claim 11, wherein the incoming frame is received at populations of Very Small Aperture Terminals (VSATs), and
   the rank table comprises selecting a rank table, from a plurality of rank tables that are mutually non-overlapping or partially over-lapping, for a population of the populations of VSATs.

20. The system of claim 11, wherein the rank table lists selected modulation and coding schemes.

* * * * *